United States Patent
Ha et al.

(10) Patent No.: US 9,059,162 B2
(45) Date of Patent: Jun. 16, 2015

(54) CHIP ON FILM (COF) SUBSTRATE, COF PACKAGE AND DISPLAY DEVICE INCLUDING THE SAME

(71) Applicant: Samsung Electronics Co., Ltd., Suwon-si (KR)

(72) Inventors: Jeong-Kyu Ha, Hwaseong-si (KR); Kwan-Jai Lee, Yongin-si (KR); Jae-Min Jung, Seoul (KR); Kyong-Soon Cho, Goyang-si (KR); Na-Rae Shin, Yongin-si (KR); Kyoung-Suk Yang, Yongin-si (KR); Pa-Lan Lee, Daegu (KR); So-Young Lim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/933,185

(22) Filed: Jul. 2, 2013

(65) Prior Publication Data
US 2014/0054793 A1    Feb. 27, 2014

(30) Foreign Application Priority Data

Aug. 23, 2012   (KR) .................. 10-2012-0092056

(51) Int. Cl.
*H01L 23/498*        (2006.01)

(52) U.S. Cl.
CPC ...... *H01L 23/49838* (2013.01); *H01L 23/4985* (2013.01); *H01L 2924/0002* (2013.01)

(58) Field of Classification Search
USPC ......... 257/693, 698, 700, 701, 702, 735, 784, 257/E23.011, E23.014, E23.015, E23.065, 257/E23.67, 690, E23.034, E23.055, 257/E23.06, E23.067
See application file for complete search history.

(56) References Cited

U.S. PATENT DOCUMENTS

| | | | |
|---|---|---|---|
| 7,589,421 B2 * | 9/2009 | Cho et al. | 257/734 |
| 7,683,471 B2 * | 3/2010 | Chung et al. | 257/688 |
| 7,705,812 B2 * | 4/2010 | Yuda et al. | 345/87 |
| 7,880,286 B2 * | 2/2011 | Lee et al. | 257/691 |
| 7,915,727 B2 * | 3/2011 | Choi et al. | 257/702 |
| 2006/0181299 A1 | 8/2006 | Hirae | |
| 2007/0235888 A1 | 10/2007 | Her | |

FOREIGN PATENT DOCUMENTS

| | | |
|---|---|---|
| JP | 09-232377 | 9/1997 |
| KR | 10-2006-0072767 A | 6/2006 |
| KR | 10-2008-0049918 A | 6/2008 |

* cited by examiner

*Primary Examiner* — Jasmine Clark
(74) *Attorney, Agent, or Firm* — Myers Bigel Sibley & Sajovec, P.A.

(57) ABSTRACT

A COF substrate may include a base film, first upper conductive patterns, at least one second upper conductive pattern and lower conductive patterns. The first upper conductive patterns may be arranged on an upper surface of the base film. Each of the first upper conductive patterns may have an inner pattern and an outer pattern spaced apart from each other. The second upper conductive pattern may be arranged on the upper surface of the base film between the first upper conductive patterns. The lower conductive patterns may be arranged on a lower surface of the base film. The lower conductive patterns may be electrically connected between the inner pattern and the outer pattern. Thus, conductive materials causing a short between the panel patterns may not exist between the inner pattern and the outer pattern on the upper surface of the base film.

20 Claims, 7 Drawing Sheets

CHIP ON FILM (COF) SUBSTRATE, COF PACKAGE AND DISPLAY DEVICE INCLUDING THE SAME

CROSS-REFERENCE TO RELATED APPLICATION

This application claims priority under 35 U.S.C. §119 to Korean Patent Application No. 10-2012-92056, filed on Aug. 23, 2012 in the Korean Intellectual Property Office (KIPO), the contents of which are herein incorporated by reference in their entirety.

BACKGROUND

1. Field

Example embodiments relate to a chip on film (COF) substrate, a COF package and a display device including the same. More particularly, example embodiments relate to a COF substrate including a base film and a chip mounted on the base film, a COF package including the COF substrate, and a display device including the COF package.

2. Description of the Related Art

Generally, a display device may include a display panel, a gate driver and a data driver. The display panel may include pixels defined by intersections between gate lines and data lines. The gate driver may drive the gate lines. The data driver may drive the data lines. The data driver may include a data integrated circuit chip for applying drive signals to the data lines. The data integrated circuit chip may be mounted on a COF substrate.

The COF substrate may include a base film on which the integrated circuit chip may be mounted, and conductive patterns may be arranged on the base film. Each of the conductive patterns may have a first end that is connected to the chip, and a second end that is connected to panel patterns of the display panel.

As the integrated circuit chip may be highly integrated, a pitch between the panel patterns may be narrow. Thus, if the panel pattern is misaligned with the conductive pattern on the base film, a short-circuit may be generated between the panel patterns.

SUMMARY

Example embodiments provide a COF substrate that may have a reduced likelihood of generating electrical short-circuits between panel patterns.

Example embodiments also provide a COF package including the above-mentioned COF substrate.

Example embodiments further provide a display device including the above-mentioned COF package.

According to some example embodiments, a COF substrate may be provided that includes a base film, first upper conductive patterns, at least one second upper conductive pattern and lower conductive patterns. The first upper conductive patterns may be arranged on an upper surface of the base film. Each of the first upper conductive patterns may have an inner pattern and an outer pattern that are spaced apart from each other. The second upper conductive pattern may be arranged on the upper surface of the base film between the first upper conductive patterns. The lower conductive patterns may be arranged on a lower surface of the base film. A respective lower conductive pattern may electrically connect a respective one of the inner patterns to a respective one of the outer patterns.

In example embodiments, the COF substrate may further include inner plugs in the base film that electrically connect the lower conductive patterns to respective ones of the inner patterns, and outer plugs in the base film that electrically connect the lower conductive patterns to respective ones of the outer patterns.

In example embodiments, a portion of a first of the inner patterns that contacts a first of the inner plugs may have a width that is greater than a width of another portion of the first of the inner patterns.

In example embodiments, a portion of a first of the outer patterns that contacts a first of the outer plugs may have a width that is greater than a width of another portion of the first of the outer patterns.

In example embodiments, the COF substrate may further include an upper inner insulating layer on the upper surface of the base film to cover the inner patterns and the inner plugs, and an upper outer insulating layer on the upper surface of the base film to cover the outer plugs and to at least partially cover the outer patterns.

In example embodiments, the second upper conductive pattern may have an end positioned between the inner pattern and the outer pattern.

In example embodiments, a plurality of second upper conductive patterns may be provided. A gap between adjacent ones of the second upper conductive patterns may be wider than a gap between an outermost of the second upper conductive patterns and the inner pattern.

In example embodiments, the COF substrate may further include a lower insulating layer on the lower surface of the base film on the lower conductive patterns.

According to some example embodiments, there may be provided a COF package. The COF package may include a base film, a chip, first upper conductive patterns, at least one second upper conductive pattern and lower conductive patterns. The chip may be on an upper surface of the base film. The first upper conductive patterns may be arranged on the upper surface of the base film. Each of the first upper conductive patterns may have an inner pattern extended from the chip along the upper surface of the base film and an outer pattern arranged on the upper surface of the base film. The inner pattern and the outer pattern may be arranged spaced apart from each other. The second upper conductive pattern may be extended from the chip on the upper surface of the base film. The second upper conductive pattern may be arranged between the first upper conductive patterns. The lower conductive patterns may be arranged on a lower surface of the base film. The lower conductive patterns may be electrically connected between the inner pattern and the outer pattern.

According to some example embodiments, there may be provided a display device. The display device may include a COF package and a display panel. The display panel may have panel patterns electrically connected to the COF package. The COF package may include a base film, a chip, first upper conductive patterns, at least one second upper conductive pattern and lower conductive patterns. The chip may be mounted on an upper surface of the base film. The first upper conductive patterns may be arranged on the upper surface of the base film. Each of the first upper conductive patterns may have an inner pattern extended from the chip along the upper surface of the base film and an outer pattern arranged on the upper surface of the base film. The outer pattern may be electrically connected to the panel patterns. The inner pattern and the outer pattern may be arranged spaced apart from each other. The second upper conductive pattern may be extended from the chip on the upper surface of the base film. The second upper conductive pattern may be arranged between the first upper conductive patterns. The second upper conductive pattern may be electrically connected to the panel patterns. The lower conductive patterns may be arranged on a lower surface of the base film. The lower conductive patterns may be electrically connected between the inner pattern and the outer pattern.

In example embodiments, each of the panel patterns may include a first panel pattern configured to contact the outer pattern of the first upper conductive pattern, and a second panel pattern configured to contact the second upper conductive pattern.

In example embodiments, the second panel pattern may have a width substantially the same as that of the first panel pattern.

In example embodiments, the second panel pattern may have a width less than that of the first panel pattern.

In example embodiments, the second panel pattern may have a contact portion configured to contact the second upper conductive pattern, and an extension portion extended from the contact portion. The extension portion may have a width less than that of the contact portion.

In example embodiments, the second panel pattern may further have a bent portion formed between the contact portion and the extension portion to form a gap between the contact portions greater than that between the extension portions.

According to example embodiments, the inner pattern and the outer pattern of the first upper conductive pattern may be connected with each other via the lower conductive pattern, so that conductive materials causing a short between the panel patterns may not exist between the inner pattern and the outer pattern on the upper surface of the base film. Thus, a short generation between the minute panel patterns may be suppressed in the COF substrate. As a result, the COF substrate may be applied to highly integrated chip and display device.

According to some example embodiments, a COF package is provided that includes a base film and a chip on an upper surface of the base film. A first conductive pattern is provided on the base film that is electrically connected to the chip, the first conductive pattern including a first inner pattern and a first outer pattern that are spaced apart from each other and extend along an upper surface of the base film in a first direction, and a first connecting conductive pattern, a first inner plug and a first outer plug that electrically connect the first inner pattern to the first outer pattern. A second conductive pattern is provided on the base film that is electrically connected to the chip, the second conductive pattern including a second inner pattern and a second outer pattern that are spaced apart from each other and extend along an upper surface of the base film in the first direction, and a second connecting conductive pattern, a second inner plug and a second outer plug that electrically connect the second inner pattern to the second outer pattern. An upper conductive pattern is provided that extends in the first direction along the upper surface of the base film, the upper conductive pattern positioned between the first conductive pattern and the second conductive pattern.

In some embodiments, the upper conductive pattern may be longer than the first and second inner patterns. The upper conductive pattern may be a first upper conductive pattern, and the COF package may further include a second upper conductive pattern that extends in the first direction along the upper surface of the base film, the second upper conductive pattern being immediately adjacent to the second conductive pattern opposite the first upper pattern. The first and second inner patterns may each include a first region and a second region that is wider than the first region in a direction substantially perpendicular to the first direction, where the first and second inner plugs are under the second regions of the respective first and second inner patterns. The COF package of may be combined with a display panel that has panel patterns that are electrically connected to the COF package to provide a display device. In such embodiments, each of the panel patterns may comprise a first panel pattern that is connected to the first outer pattern, a second panel pattern that is connected to the second outer pattern, and a third panel pattern that is connected to the upper conductive pattern, the third panel pattern including a contact portion that contacts the upper conductive pattern and an extension portion that extends from the contact portion to the display panel, the extension portion having a width that is narrower than a width of the contact portion.

BRIEF DESCRIPTION OF THE DRAWINGS

Example embodiments will be more clearly understood from the following detailed description taken in conjunction with the accompanying drawings.

FIG. 1 is a perspective view illustrating a COF substrate in accordance with example embodiments;

FIG. 2 is a plan view illustrating the COF substrate of FIG. 1;

FIG. 3 is a cross-sectional view taken along a line in FIG. 1;

FIG. 4 is a cross-sectional view taken along a line IV-IV' in FIG. 1;

FIG. 5 is a perspective view illustrating a COF substrate in accordance with example embodiments;

FIG. 6 is a plan view illustrating the COF substrate of FIG. 5;

FIG. 7 is a cross-sectional view illustrating a COF package including the COF substrate of FIG. 1;

FIG. 8 is a plan view illustrating the COF package of FIG. 7;

FIG. 9 is a plan view illustrating a COF package including the COF substrate of FIG. 6;

FIG. 10 is a plan view illustrating a display device including the COF package of FIGS. 7 and 8;

FIG. 11 is an enlarged perspective view illustrating a connection structure between a chip of the COF package of FIG. 7 and a display panel of the display device of FIG. 10;

FIG. 12 is an enlarged perspective view illustrating a connection structure between a chip of the COF package of FIG. 7 and a display panel of a display device;

FIG. 13 is an enlarged perspective view illustrating a connection structure between a chip of the COF package of FIG. 9 and a display panel of a display device; and FIG. 14 is an enlarged perspective view illustrating a connection structure between a chip of the COF package of FIG. 9 and a display panel of a display device.

DETAILED DESCRIPTION OF THE EMBODIMENTS

Figure 1:
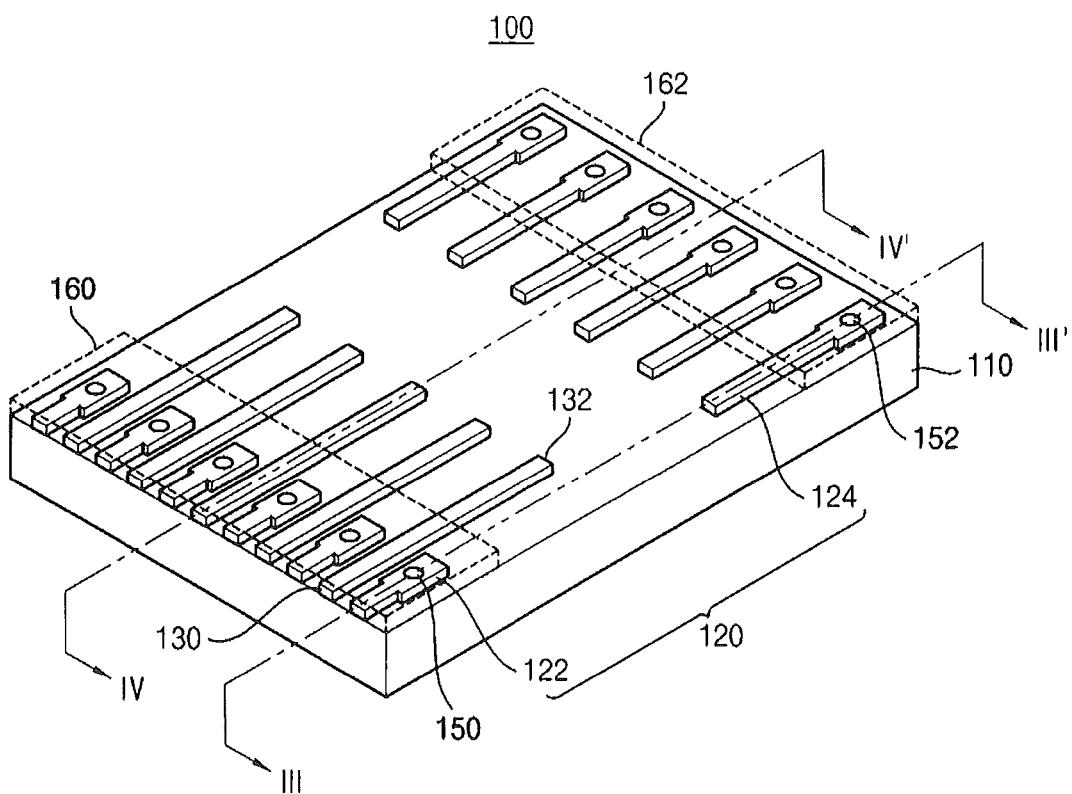
FIGS. 1 to 14 represent non-limiting, example embodiments as described herein.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

COF Substrate

Figure 2:
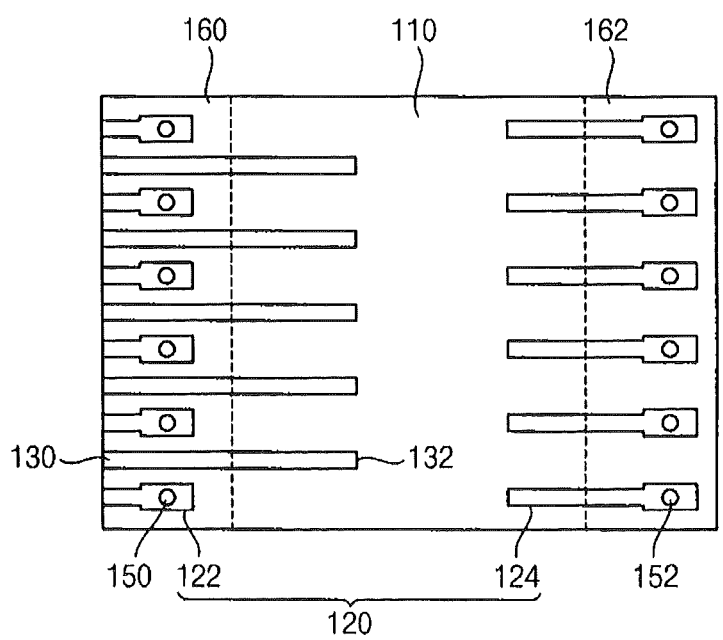
Figure 3:
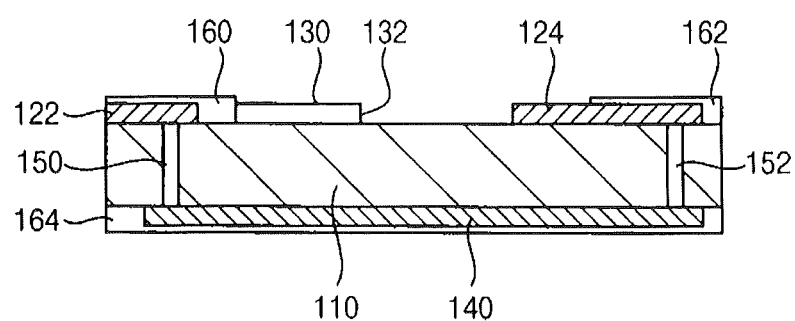
Figure 4:
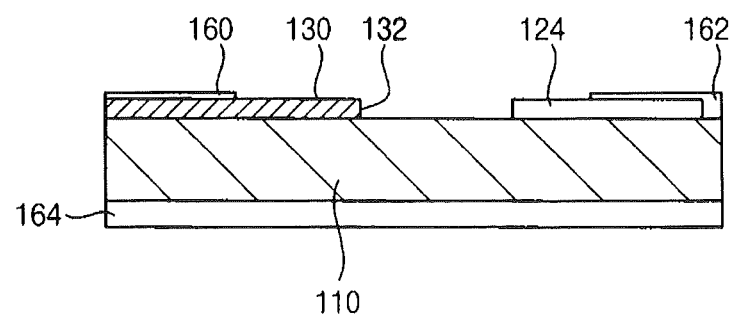

FIG. 1 is a perspective view illustrating a COF substrate in accordance with example embodiments. FIG. 2 is a plan view of the COF substrate of FIG. 1. FIG. 3 is a cross-sectional view taken along the line III-III' in FIG. 1. Finally, FIG. 4 is a cross-sectional view taken along the line IV-IV' in FIG. 1.

Referring to FIGS. 1 to 4, a COF substrate 100 of this example embodiment may include a base film 110, first upper conductive patterns 120, second upper conductive patterns 130 and lower conductive patterns 140.

The base film 110 may include an insulating material. A chip (not shown) may be mounted on an upper central surface of the base film 110. The chip may function to drive a semiconductor device, a display device, etc.

Each of the first upper conductive patterns 120 may include inner patterns 122 and outer patterns 124. The inner patterns 122 may be arranged on the upper surface of the base film 110 in a first direction. The inner patterns 122 may extend along the upper surface of the base film 110. The inner patterns 122 may be electrically connected to the chip. The outer patterns 124 may also be arranged on the upper surface of the base film 110 in the first direction. Thus, the inner patterns 122 and the outer patterns 124 may extend in substantially the same direction.

In example embodiments, the outer patterns 124 may be spaced apart from the inner patterns 122. The outer patterns 124 may be electrically connected to respective panel patterns (not shown) that extend from the display panel (not shown). Thus, a conductive material may not exist on a portion of the upper surface of the base film 110 between the inner patterns 122 and the outer patterns 124. Because the inner patterns 122 and the outer patterns 124 may be spaced apart from each other, the outer patterns 124 may not be electrically connected to the inner patterns 122. As a result, the outer patterns 124 may not be electrically connected to the chip along the upper surface of the base film 110.

The lower conductive patterns 140 may be arranged on a lower surface of the base film 110, and may extend in the first direction. Each lower conductive pattern 140 may be positioned under a respective one of the inner patterns 122 and a respective one of the outer patterns 124 to electrically connect the inner pattern 122 to the outer pattern 124.

In example embodiments, each inner pattern 122 may be electrically connected to a respective one of the lower conductive patterns 140 via an inner plug 150. Each inner plug 150 may be formed in a hole that is formed vertically through the base film 110. Thus, each inner plug 150 may have an upper end that is configured to make contact with its corresponding inner pattern 122, and a lower end that is configured to make contact with its corresponding lower conductive pattern 140.

In example embodiments, each outer pattern 124 may be electrically connected to a respective one of the lower conductive patterns 140 via an outer plug 152. Each outer plug 152 may be formed in a hole that is formed vertically through the base film 110. Thus, each outer plug 152 may have an upper end that is configured to make contact with a respective one of the outer patterns 124, and a lower end that is configured to make contact with a respective one of the lower conductive patterns 140. Thus, the panel pattern may be electrically connected to the chip via the outer patterns 124, the outer plugs 152, the lower conductive patterns 140, the inner plugs 150 and the inner patterns 122.

In example embodiments, a portion of each inner pattern 122 that overlies its corresponding inner plug 150 may have a width that is greater than a width of the remainder of the inner pattern 122. The wide portions on each of the inner patterns 122 may facilitate providing an accurate contact between each inner pattern 122 and its corresponding inner plug 150. The width of the inner pattern 122 may correspond to a length of the inner pattern 122 in a second direction that is substantially perpendicular to the first direction and substantially parallel to a plane defined by the upper surface of the base film 110.

The second upper conductive patterns 130 may also be arranged on the upper surface of the base film 110. Each second upper conductive pattern 130 may extend in the first direction. The second upper conductive patterns 130 may have a linear shape and may extend from the chip. The second upper conductive patterns 130 may be electrically connected to the panel pattern. Thus, the panel pattern may be directly electrically connected to the chip via the second upper conductive patterns 130.

In example embodiments, each of the second upper conductive patterns 130 may be positioned between the first upper conductive patterns 120. The second upper conductive patterns 130 may extend so that they are substantially parallel to the first upper conductive patterns 120. Each of the second upper conductive patterns 130 may have an end that is positioned between the inner patterns 122 and the outer patterns 124. Thus, the first upper conductive patterns 120 are arranged to only be on one side of the ends 132 of the second upper conductive patterns 130. Accordingly, conductive materials that could potentially cause an electrical short-circuit between the panel patterns may not exist at both sides of the ends 132 of the second upper conductive patterns 130. As a result, the potential for electrical short-circuits between a portion of the panel pattern that is connected to the second upper conductive patterns 130 and a portion of the panel pattern that is connected to the outer patterns 124 of the first upper conductive patterns 120 may be reduced.

In example embodiments, the first upper conductive patterns 120, the second upper conductive patterns 130, the lower conductive patterns 140, the inner plug 150 and the outer plug 152 may include substantially the same material. For example, the same material may include a metal such as copper.

An upper inner insulating layer 160 may be formed on the upper surface of the base film 110 to cover the inner patterns 122, the inner plugs 150 and the second upper conductive patterns 130. In example embodiments, the upper inner insulating layer 160 may fully cover the inner patterns 122 and the inner plugs 150 to protect the inner patterns 122 and the inner plugs 150 from the external environment. In contrast, because the ends 132 of the second upper conductive patterns 130 may be connected to the panel pattern, the upper inner insulating layer 160 may only partially cover the second upper conductive patterns 130 and may leave the ends 132 of the second upper conductive patterns 130 exposed.

An upper outer insulating layer 162 may be formed on the upper surface of the base film 110 to cover the outer plugs 152 and the outer patterns 124. In example embodiments, the upper outer insulating layer 162 may fully cover the outer plugs 152 to protect the outer plugs 152 from the external environments. In contrast, because the outer patterns 124 may be connected to the panel pattern, portions of the outer patterns 124 may be exposed by the upper outer insulating layer 162.

A lower insulating layer 164 may be formed on the lower surface of the base film 110 to cover the lower conductive patterns 140. The lower insulating layer 164 may protect the lower conductive patterns 140 from the external environment.

In example embodiments, the upper inner insulating layer 160, the upper outer insulating layer 162 and the lower insulating layer 164 may include substantially the same material. For example, the same material may include a solder resist.

According to this example embodiment, the inner patterns 122 and the outer patterns 124 of the first upper conductive pattern 120 may be connected to each other via the lower conductive patterns 140, so that a conductive material that may cause an electrical short-circuit between the panel patterns may not exist at the both sides of the ends 132 of the second upper conductive patterns 130. Thus, the generation of electrical short-circuits between the small panel patterns may be reduced in the COF substrate.

Figure 5:
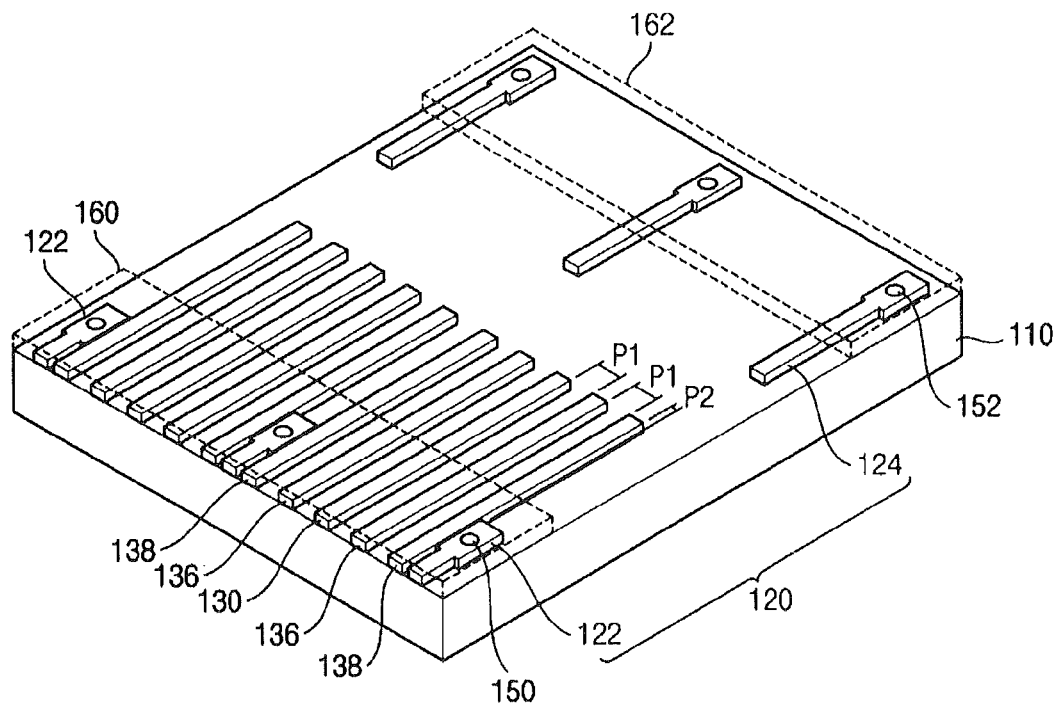
Figure 6:
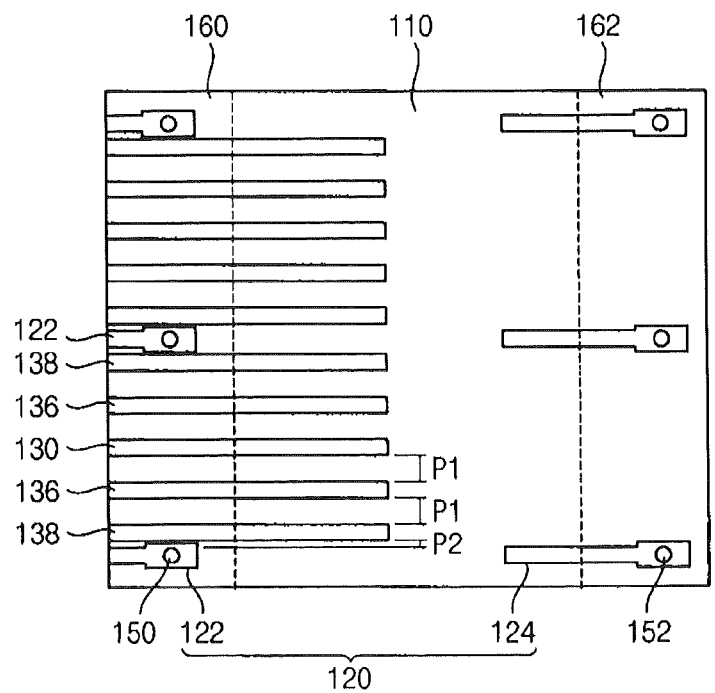

FIG. 5 is a perspective view illustrating a COF substrate in accordance with further example embodiments. FIG. 6 is a plan view illustrating the COF substrate of FIG. 5.

The COF substrate 100a of this example embodiment may include elements that are substantially the same as those of the COF substrate 100 in FIG. 1 except that the COF substrate 100a further includes third upper conductive patterns and fourth upper conductive patterns. Thus, the same reference numerals may refer to the same elements and further discussion with respect to the same elements may be omitted herein for brevity.

Referring to FIGS. 5 and 6, a third upper conductive pattern 136 may be provided on each side of each second upper conductive pattern 130. A fourth upper conductive pattern 138 may be provided between each third upper conductive pattern 136 and the inner pattern 122 of the first upper conductive pattern 120. Thus, the third upper conductive patterns 136 and the fourth upper conductive patterns 138 may be positioned between the first upper conductive patterns 120. That is, a second upper conductive pattern 130, two third upper conductive patterns 136 and two fourth upper conductive patterns 138 may be provided between adjacent first upper conductive patterns 120. Each of the third and fourth upper conductive patterns 136 and 138 may have a first end that is connected to the chip, and a second end that is connected to the panel pattern.

In example embodiments, the third upper conductive patterns 136 and the fourth upper conductive patterns 138 may have a shape substantially the same as that of the second upper conductive patterns 130. Therefore, any further discussion of the shapes of the third upper conductive patterns 136 and the fourth upper conductive patterns 138 may be omitted herein for brevity.

In example embodiments, a gap between each second upper conductive pattern 130 and the third upper conductive patterns 136 that are on each side of the second conductive pattern 130 may have a first pitch P1. A gap between the third upper conductive pattern 136 and the fourth upper conductive pattern 138 that is immediately adjacent to it may also have the first pitch P1. Thus, the gap between a second upper conductive pattern 130 and an adjacent third upper conductive pattern 136 may be substantially the same as the gap between a third upper conductive pattern 136 and an adjacent fourth upper conductive pattern 138.

In contrast, a gap between the fourth upper conductive pattern 138 and the inner pattern 122 may have a second pitch P1 that is shorter than the first pitch P1. Therefore, a gap between the inner pattern 122 and an outermost linear conductive pattern (i.e., one of the fourth conductive patterns 138) 120 may be shorter than the gaps between the remainder of the linear conductive patterns.

In example embodiments, five linear upper conductive patterns 130, 136 and 138 may be arranged between adjacent first upper conductive patterns 120. Alternatively, two to four linear conductive patterns or at least six linear conductive patterns may be arranged between adjacent first upper conductive patterns 120.

COF Package

Figure 7:
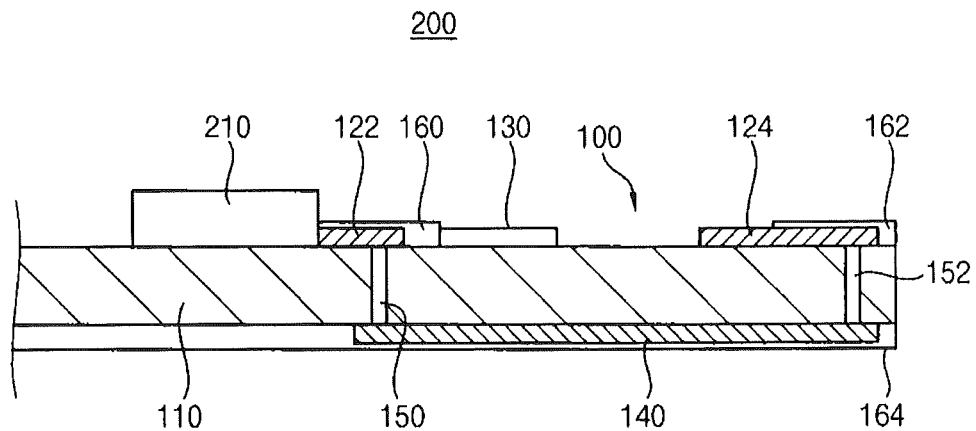
Figure 8:
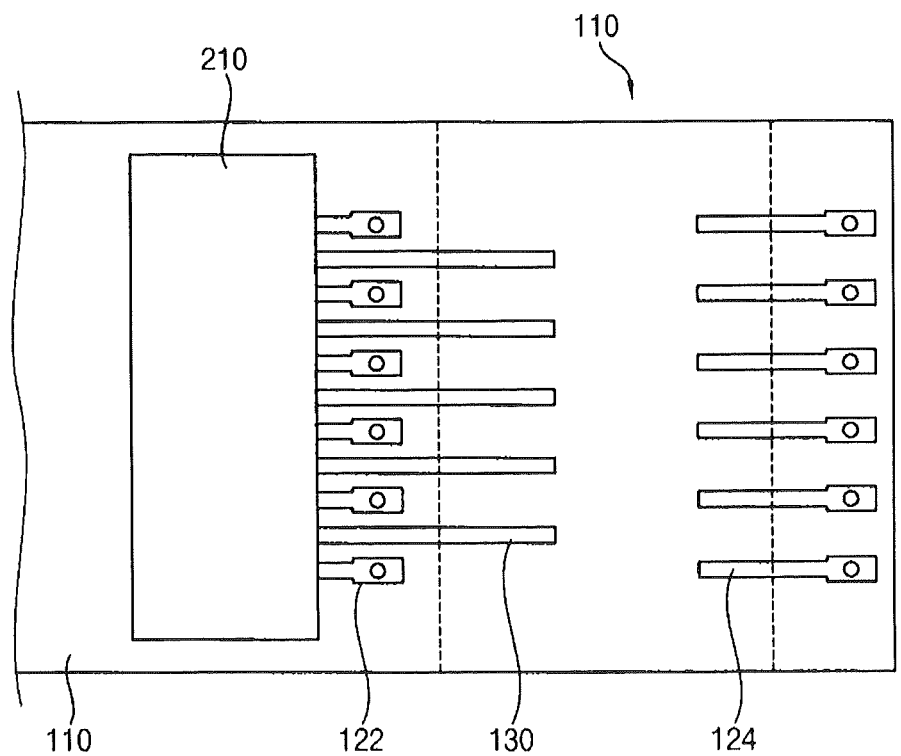

FIG. 7 is a cross-sectional view illustrating a COF package 200 that includes the COF substrate 100 of FIG. 1. FIG. 8 is a plan view of the COF package 200 of FIG. 7.

Referring to FIGS. 7 and 8, the COF package 200 of this example embodiment may include a chip 210 and the COF substrate 100.

As shown in FIGS. 7 and 8, the inner patterns 122 of the first upper conductive patterns 120 may be connected to the chip 210. Therefore, the chip 210 may be electrically connected with the outer patterns 124 of the first upper conductive patterns 120 via the inner patterns 122, the inner plugs 150 and the lower conductive patterns 140. The second upper conductive patterns 130 may also be electrically connected to the chip 210.

Figure 9:
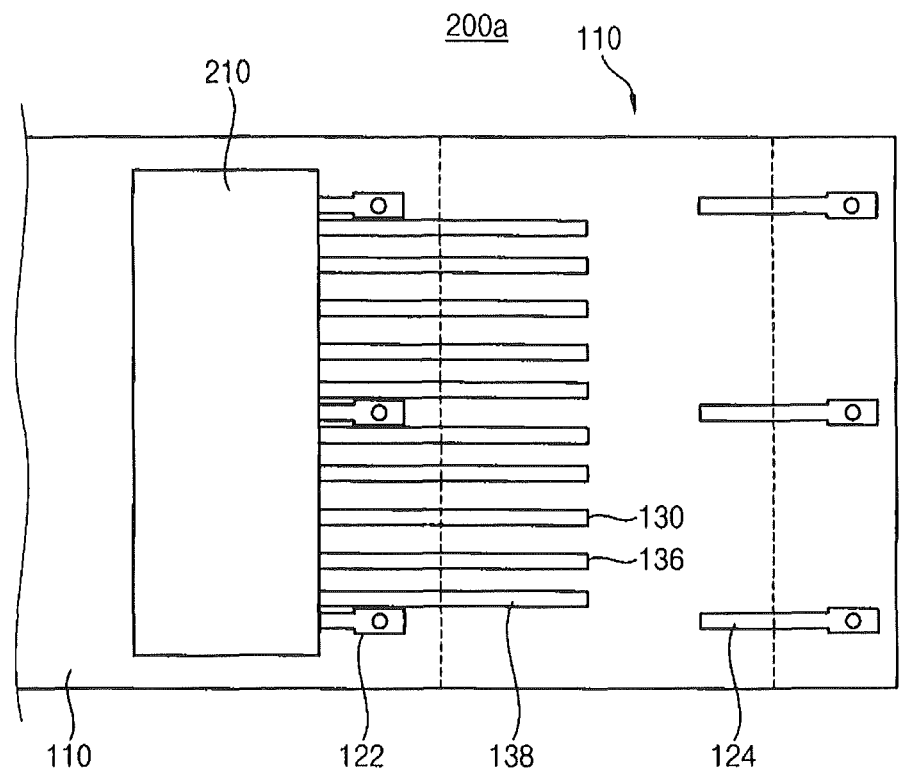

FIG. 9 is a plan view of a COF package 200a that includes the COF substrate 100a of FIG. 6 and an integrated circuit chip 210.

As shown in FIG. 9, the inner patterns 122 of the first upper conductive patterns 120 may be connected to the chip 210. Therefore, the chip 210 may be electrically connected with the outer patterns 124 of the first upper conductive patterns 120 via the inner patterns 122, the inner plugs 150 and the lower conductive patterns 140.

The second upper conductive patterns 130 may be electrically connected to the chip 210. The third upper conductive patterns 136 and the fourth upper conductive patterns 138 may also be electrically connected to the chip 210.

Display Device

Figure 10:
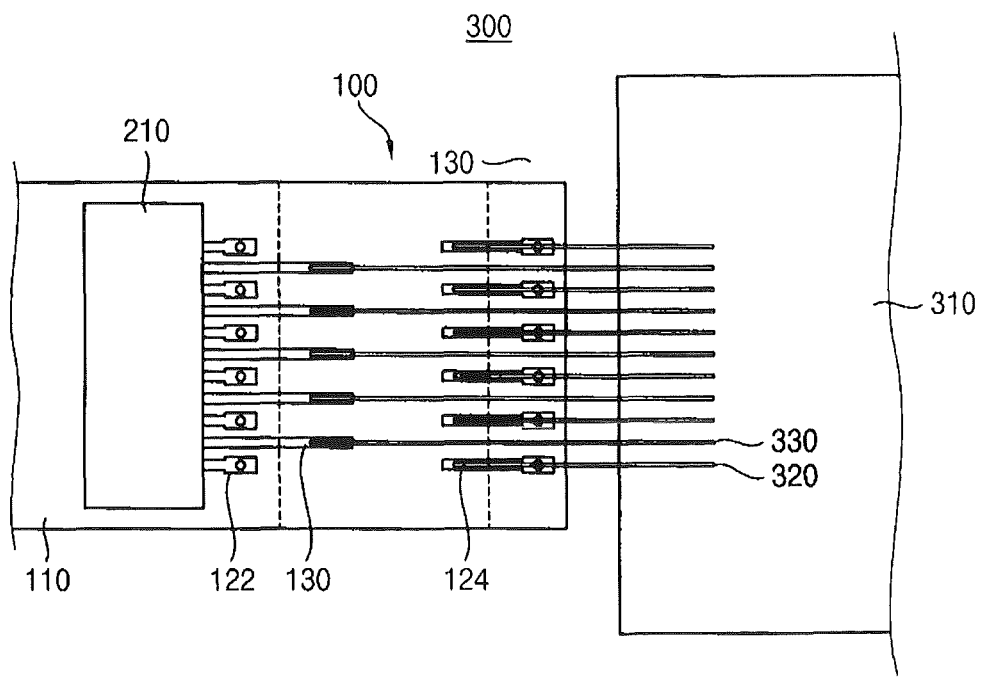
Figure 11:
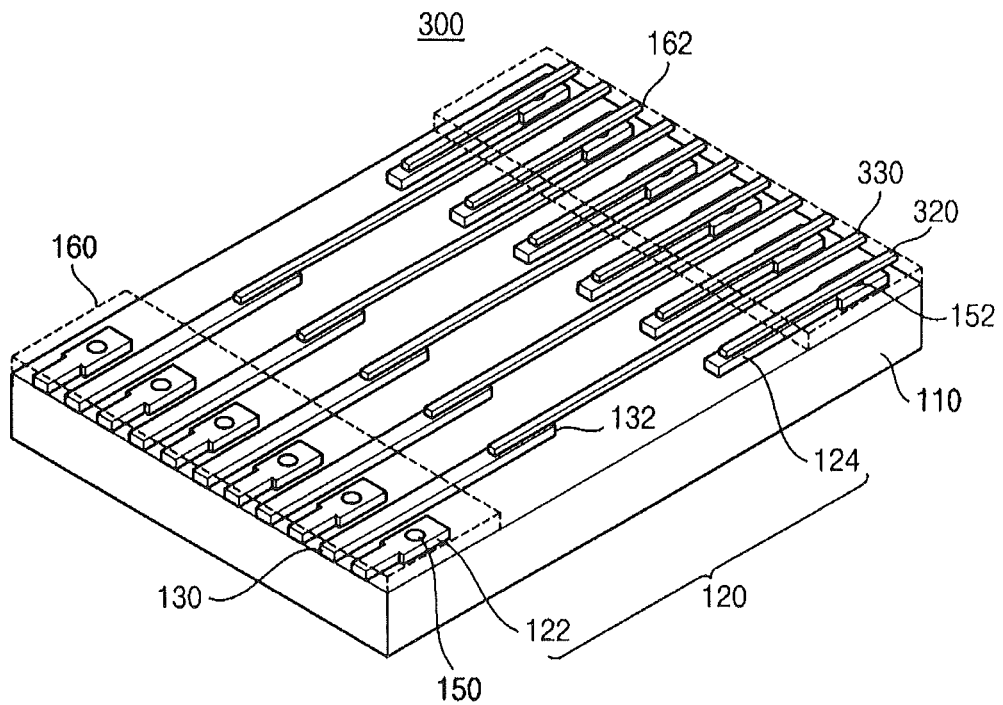

FIG. 10 is a plan view of a display device 300 that includes the COF package 200 of FIGS. 7 and 8. FIG. 11 is an enlarged perspective view illustrating the connection structure between the chip 210 of COF package 200 and the display panel 310 of the display device 300 of FIG. 10.

Referring to FIGS. 10 and 11, the display device 300 of this example embodiment includes the COF package 200 and the display panel 310.

In example embodiments, the COF package 200 may include elements substantially the same as those of the COF package 200 of FIG. 7. Thus, the same reference numerals may refer to the same elements and any further discussion of those elements may be omitted herein for brevity.

The display panel 310 may include odd panel patterns 320 and even panel patterns 330. In example embodiments, the odd panel patterns 320 and the even panel patterns 330 may have substantially the same width. The display panel 310 may include a liquid crystal display (LCD) panel, a plasma display panel, an organic light emitting display (OLED) panel, etc.

In example embodiments, the odd panel patterns 320 may be connected to respective ones of the outer patterns 124 of the first upper conductive patterns 120. Each odd panel pattern 320 may be electrically connected to the chip 210 via a respective one of the outer patterns 124, the outer plugs 152, the lower conductive patterns 140, the inner plugs 150 and the inner patterns 122.

In contrast, the even panel patterns 330 may be connected to the second upper conductive patterns 130. Thus, the even panel patterns 330 may be longer than the odd panel patterns 320. The even panel patterns 330 may be electrically connected with the chip 210 via only the second upper conductive patterns 130.

Figure 12:
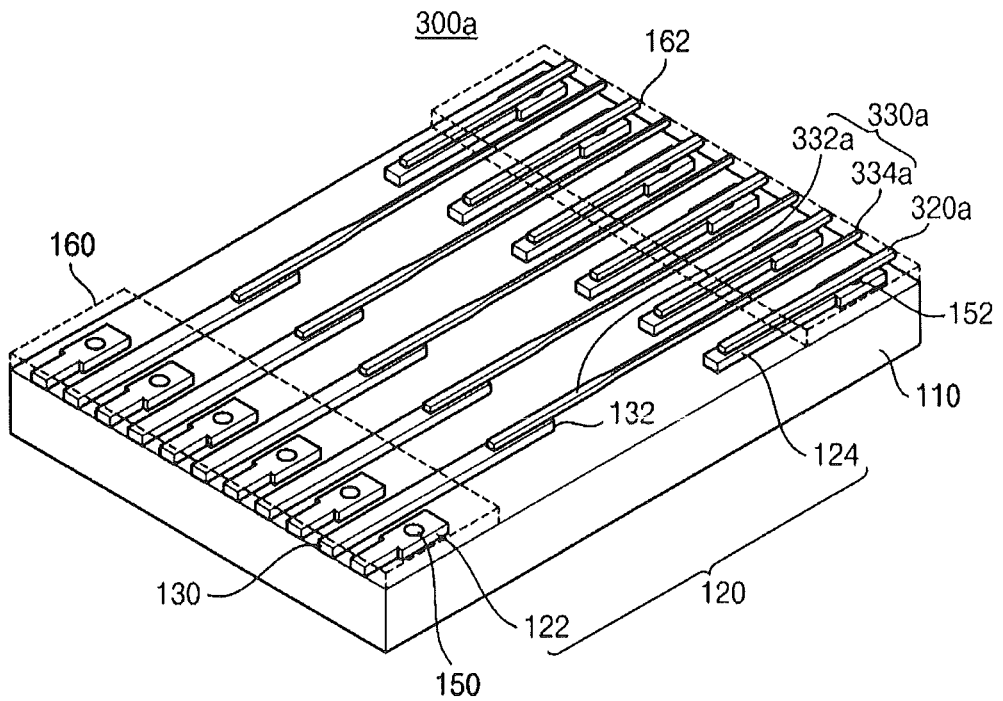

FIG. 12 is an enlarged perspective view illustrating a connection structure between the chip 210 of the COF package 200 and a display panel of a display device.

In example embodiments, the display device 300a may include elements substantially the same as those of the display device 300 of FIG. 11 except for panel patterns. Thus, the same reference numerals may refer to the same elements and any further discussion with respect to those elements may be omitted herein for brevity.

Referring to FIG. 12, the odd panel patterns 320a of the display device 300a in accordance with this example embodiment may have a shape substantially the same as that of the odd panel patterns 320 in FIG. 11. Thus, any further discussion with respect to the odd panel patterns 320a may be omitted herein for brevity.

In contrast, the even panel patterns 330a may include a contact portion 332a and an extension portion 334a. The contact portion 332a may be configured to make contact with one of the second upper conductive patterns 130. In example embodiments, the contact portions 332a may each have a width substantially the same as a width of the odd panel patterns 320a.

The extension portions 334a may extend from the respective contact portions 332a to the display panel 310. Thus, the extension portions 334a may be positioned between the odd panel patterns 320a. In example embodiments, each extension portion 334a may have a width that is narrower than a width of its corresponding contact portion 332a. Consequently, the width of each extension portion 334a may be narrower than the width of the odd panel patterns 320a.

According to this example embodiment, the extension portion 334a between the odd panel patterns 320a may have the width narrower than that of the odd panel patterns 320a in order to reduce the likelihood that an electrical short-circuit develops between an extension portion 334a and an adjacent odd panel pattern 320a.

Figure 13:
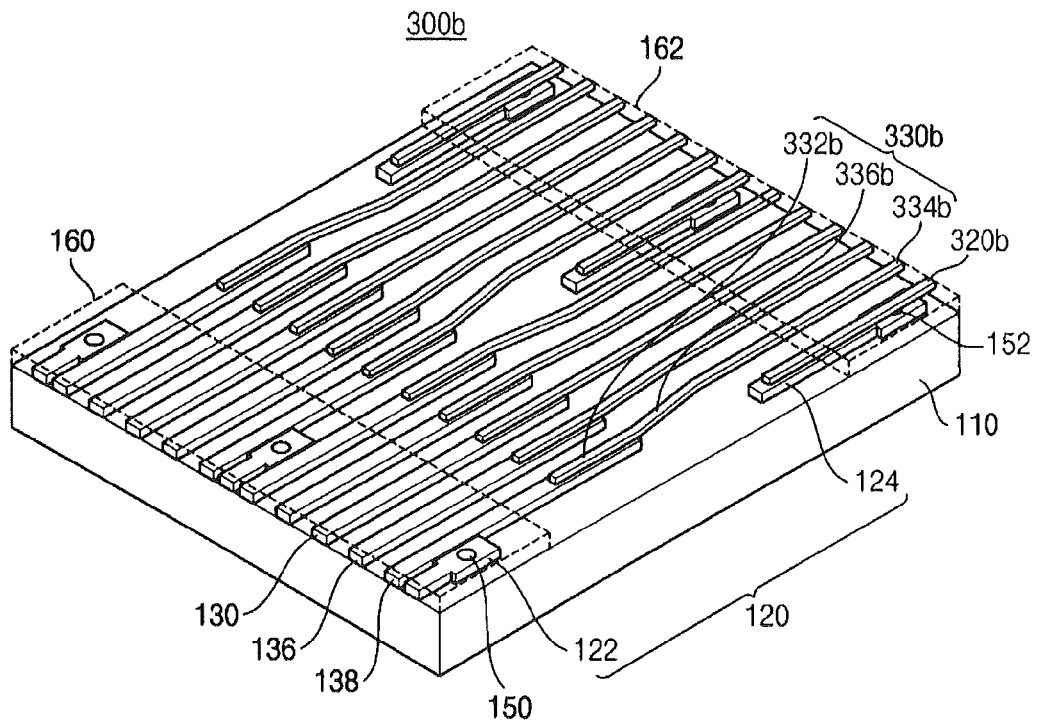

FIG. 13 is an enlarged perspective view illustrating a connection structure between the chip 210 of the COF package 200a and a display panel of a display device 300b.

Referring to FIG. 13, in example embodiments, the COF package 200a may include elements that are substantially the same as those of the COF package 200a of FIG. 9. Thus, the same reference numerals may refer to the same elements and any further discussion with respect to the same elements may be omitted herein for brevity.

The display panel 310 may include first panel patterns 320b and second panel patterns 330b. In example embodiments, the first panel patterns 320b and the second panel patterns 330b may have substantially the same width.

In example embodiments, the first panel patterns 320b may be connected to the outer patterns 124 of the first upper conductive patterns 120. The first panel patterns 320b may be electrically connected to the chip 210 (not shown) via the outer patterns 124, the outer plugs 152, the lower conductive patterns 140, the inner plugs 150 and the inner patterns 122.

In contrast, the second panel patterns 330b may be directly connected to the second upper conductive patterns 130. Therefore, the second panel patterns 330b may have a length longer than that of the first panel patterns 320b. The second panel patterns 330b may be electrically connected to the chip 210 via only the second upper conductive patterns 130.

The second panel patterns 330b may include a contact portion 332b, an extension portion 334b and a bent portion 336b. Each contact portion 332b may be configured to make contact with a respective one of the second upper conductive patterns 130. The extension portions 334b may extend from their respective contact portions 334b to the display panel 310. The bent portion 336b may be arranged between the contact portion 332b and the extension portion 334b. The bent portion 336b may have a slightly bent shape toward the first upper conductive pattern 120. Thus, a gap between the extension portion 334b and the outer pattern 124 may be wider than a gap between the contact portion 332b and the inner pattern 122 due to the bent portion 336b.

As mentioned above, in the COF substrate 100a of FIG. 5, the gap between the fourth upper conductive pattern 138 and the inner pattern 122 may have the second pitch P2 that is shorter than the first pitch P1, so that the bent portion 336b of the second panel pattern 330b may correspond to the structure of the COF substrate 100a.

In example embodiments, the contact portion 332b, the extension portion 334b and the bent portion 336b may have substantially the same width.

In example embodiments, the first and second panel patterns 320b and 330b may have a sufficiently wide gap, so that the likelihood of an electrical short-circuit between the first panel pattern 320b and the second panel pattern 330b may be reduced.

Figure 14:
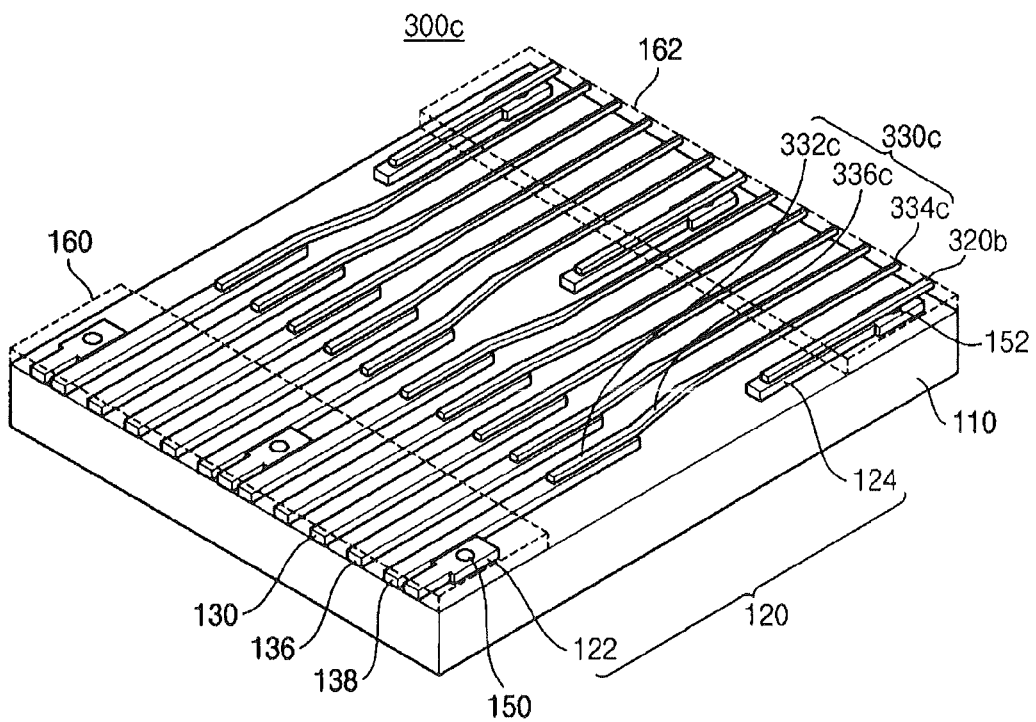

FIG. 14 is an enlarged perspective view illustrating a connection structure between the chip 210 of the COF package 200a of FIG. 9 and a display panel of a display device 300c.

In example embodiments, a display device 300c of this example embodiment may include elements that are substantially the same as those of the display device 300b of FIG. 13 except for second panel patterns. Thus, the same reference numerals may refer to the same elements and any further discussion with respect to those elements may be omitted herein for brevity.

Referring to FIG. 14, the display device 300c may include second panel patterns 330c may include a contact portion 332c, an extension portion 334c and a bent portion 336c. That is, the second panel patterns 330c may have a shape substantially similar to that of the second panel patterns 330b of FIG. 13. However, the extension portion 334c may have a width narrower than that of the contact portion 332c.

According to this example embodiment, because the width of the extension portion 334c may be narrower than the width of the contact portion 332c, the likelihood of an electrical short-circuit between the extension portion 334c and the first panel pattern 320b may be reduced.

According to example embodiments, the inner pattern and the outer pattern of the first upper conductive pattern may be electronically connected to each other via the lower conductive pattern, so that conductive materials causing a short between the panel patterns may not exist between the inner pattern and the outer pattern on the upper surface of the base film. Thus, a short generation between the small panel patterns may be suppressed in the COF substrate. As a result, the COF substrate may be applied to a highly integrated chip and display device.

The foregoing is illustrative of example embodiments and is not to be construed as limiting thereof. Although a few example embodiments have been described, those skilled in the art will readily appreciate that many modifications are possible to the example embodiments without materially departing from the novel teachings and advantages of the present invention. Accordingly, all such modifications are intended to be included within the scope of the present invention as defined in the claims.

What is claimed is:

1. A chip on film (COF) substrate comprising:
a base film;
first upper conductive patterns arranged on an upper surface of the base film, each of the first upper conductive patterns including inner patterns and outer patterns that are spaced apart from each other;
second upper conductive patterns that are arranged on the upper surface of the base film between the first upper conductive patterns; and
lower conductive patterns arranged on a lower surface of the base film that electrically connect respective ones of the inner patterns to respective ones of the outer patterns.

2. The COF substrate of claim 1, wherein the second upper conductive patterns are longer than the inner patterns.

3. The COF substrate of claim 1, wherein a first gap between adjacent ones of the second upper conductive patterns is wider than a second gap between an outermost of the second upper conductive patterns and an adjacent one of the inner patterns.

4. The COF substrate of claim 1, further comprising a lower insulating layer on the lower surface of the base film on the lower conductive patterns, wherein respective ones of the second conductive patterns and respective ones of the inner patterns are arranged in alternating fashion opposite the outer patterns.

5. The COF substrate of claim 1, in combination with a chip on an upper surface of the base film to provide a COF package, wherein the inner patterns and at least one of the second upper conductive patterns extend from the chip.

6. The COF package of claim 5, in combination with a display panel including panel patterns that are electrically connected to the COF package to provide a display device.

7. The display device of claim 6, wherein each of the panel patterns comprise:
first panel patterns configured to contact respective ones of the outer patterns of the first upper conductive patterns; and
second panel patterns configured to contact respective ones of the second upper conductive patterns.

8. The display device of claim 7, wherein each of the second panel patterns has a width that is substantially the same as a width of a first of the first panel patterns.

9. The display device of claim 7, wherein each of the second panel patterns has a width that is narrower than a width of each of the first panel patterns.

10. The display device of claim 7, wherein a first of the second panel patterns comprises:
a contact portion configured to contact a respective one of the second upper conductive patterns; and
an extension portion that extends from the contact portion to the display panel, the extension portion having a width that is narrower than a width of the contact portion.

11. The display device of claim 10, wherein the first of the second panel patterns further comprises a bent portion that extends between the contact portion and the extension portion to form a gap between the contact portions that is greater than a gap between the extension portions.

12. A chip on film (COF) substrate comprising:
a base film;
first upper conductive patterns arranged on an upper surface of the base film, each of the first upper conductive patterns including inner patterns and outer patterns that are spaced apart from each other;

second upper conductive patterns that are arranged on the upper surface of the base film between the first upper conductive patterns;

lower conductive patterns arranged on a lower surface of the base film that electrically connect respective ones of the inner patterns to respective ones of the outer patterns;

a plurality of inner plugs in the base film that electrically connect the lower conductive patterns to respective ones of the inner patterns; and a plurality of outer plugs in the base film that electrically connect the lower conductive patterns to respective ones of the outer patterns.

13. The COF substrate of claim 12, wherein a portion of a first of the inner patterns that contacts a first of the inner plugs has a first width that is greater than a second width of another portion of the first of the inner patterns.

14. The COF substrate of claim 12, wherein a portion of a first of the outer patterns that contacts a first of the outer plugs has a first width greater than a second width of another portion of the first of the outer patterns.

15. The COF substrate of claim 12, further comprising:

an upper inner insulating layer on the upper surface of the base film to cover the inner patterns and the inner plugs; and an upper outer insulating layer on the upper surface of the base film to cover the outer plugs and to at least partially cover the outer patterns.

16. A chip on film (COF) package comprising:

a base film;

a chip on an upper surface of the base film;

a first conductive pattern on the base film that is electrically connected to the chip, the first conductive pattern including a first inner pattern and a first outer pattern that are spaced apart from each other and extend along an upper surface of the base film in a first direction, and a first connecting conductive pattern, a first inner plug and a first outer plug that electrically connect the first inner pattern to the first outer pattern;

a second conductive pattern on the base film that is electrically connected to the chip, the second conductive pattern including a second inner pattern and a second outer pattern that are spaced apart from each other and extend along an upper surface of the base film in the first direction, and a second connecting conductive pattern, a second inner plug and a second outer plug that electrically connect the second inner pattern to the second outer pattern; and an upper conductive pattern that extends in the first direction along the upper surface of the base film, the upper conductive pattern positioned between the first conductive pattern and the second conductive pattern.

17. The COF package of claim 16, wherein the upper conductive pattern is longer than the first and second inner patterns.

18. The COF package of claim 16, wherein the upper conductive pattern comprises a first upper conductive pattern, the COF package further comprising a second upper conductive pattern that extends in the first direction along the upper surface of the base film, the second upper conductive pattern immediately adjacent to the second conductive pattern opposite the first upper pattern.

19. The COF package of claim 18, wherein the first and second inner patterns each include a first region and a second region that is wider than the first region in a direction substantially perpendicular to the first direction, wherein the first and second inner plugs are under the second regions of the respective first and second inner patterns.

20. The COF package of claim 16 in combination with a display panel including panel patterns that are electrically connected to the COF package to provide a display device, wherein each of the panel patterns comprises:

a first panel pattern that is connected to the first outer pattern;

a second panel pattern that is connected to the second outer pattern; and a third panel pattern that is connected to the upper conductive pattern, the third panel pattern including a contact portion that contacts the upper conductive pattern and an extension portion that extends from the contact portion to the display panel, the extension portion having a width that is narrower than a width of the contact portion.

* * * * *